United States Patent
Culpepper et al.

(10) Patent No.: US 7,459,642 B2
(45) Date of Patent: Dec. 2, 2008

(54) RIM SLOT FILLER MODULE AND METHOD OF MANUFACTURING THE SAME

(75) Inventors: Martin L. Culpepper, Marblehead, MA (US); Rohit Girdhar, San Jose, CA (US); Sarosh M. Patel, Sunnyvale, CA (US)

(73) Assignee: Teradyne, Inc., North Reading, MA (US)

( * ) Notice: Subject to any disclaimer, the term of this patent is extended or adjusted under 35 U.S.C. 154(b) by 1159 days.

(21) Appl. No.: 10/261,006

(22) Filed: Sep. 30, 2002

(65) Prior Publication Data

US 2005/0231920 A1 Oct. 20, 2005

(51) Int. Cl.
*H01L 23/28* (2006.01)
(52) U.S. Cl. .................. 174/521; 361/727; 361/728
(58) Field of Classification Search .................. 174/521; 361/724, 727, 688, 690, 728
See application file for complete search history.

(56) References Cited

U.S. PATENT DOCUMENTS

| 4,399,485 | A  | * | 8/1983 | Wright et al. ............... 361/693 |
| 4,894,749 | A  | * | 1/1990 | Elko et al. ................... 361/690 |
| 6,865,092 | B2 | * | 3/2005 | Joist et al. ................... 361/818 |
| 6,866,908 | B2 | * | 3/2005 | Lichtenstein et al. ........ 428/35.7 |
| 2002/0012237 | A1 | * | 1/2002 | Dimarco .................... 361/796 |
| 2004/0001320 | A1 | * | 1/2004 | Baar et al. .................. 361/727 |
| 2005/0157467 | A1 | * | 7/2005 | Malone et al. ............. 361/690 |
| 2005/0157472 | A1 | * | 7/2005 | Malone et al. ............. 361/724 |

* cited by examiner

*Primary Examiner*—Hung V Ngo
(74) *Attorney, Agent, or Firm*—Daly, Crowley, Mofford & Durkee, LLP

(57) ABSTRACT

A slot filler module is presented. The slot filler module includes a RIM molded encapsulant, an insert disposed in a predetermined location within the encapsulant and a connector disposed proximate a first end of the RIM molded encapsulant.

20 Claims, 4 Drawing Sheets

RIM SLOT FILLER MODULE AND METHOD OF MANUFACTURING THE SAME

CROSS REFERENCE TO RELATED APPLICATIONS

Not Applicable.

STATEMENT REGARDING FEDERALLY SPONSORED RESEARCH

Not Applicable.

FIELD OF THE INVENTION

The present invention relates generally to slot filler modules and more particularly to a reaction injection molded slot filler module having an insert disposed in a predetermined location within the module.

BACKGROUND OF THE INVENTION

Slot filler modules are well known to those skilled in the art. Slot filler modules may be used to fill non-populated slots in a system. A system may require any number of slot filler modules. For example, the Catalyst Tiger Test system (available from Teradyne Inc. of Boston, Mass.) requires no slot filler modules in a system fully loaded with channel cards, but may require up to twenty-four slot filler modules in a partially loaded system.

Slot filler modules provide several functions. In certain systems, inflatable bladders are placed between adjacent electronic modules to cool the modules. These bladders expand upon system power up and press against lateral surfaces of the modules to provide cooling. These bladders of cooling liquid are sometimes referred to as Liquid Cooling Modules (LCMs). Accordingly, every slot must have either an electronics module or a filler module in order to constrain the bladder's expansion below a critical state to prevent bladder damage and/or failure from over inflation of the bladder. The module provides a generally uniform and smooth surface for the bladders to expand against.

Preferably a slot filler module has approximately the same mass and approximately the same center of mass as an electronics module such that the mass and mass distribution within a system is substantially the same regardless of whether the system is populated with electronic or filler modules. Further, the slot filler module is preferably ESD compliant and does not interfere with system grounding requirements.

In the prior art aluminum slot filler modules have been used, however there are several drawbacks associated with these aluminum slot filler modules. A first drawback is that the aluminum slot filler modules are relatively expensive due to the cost of aluminum. Another drawback is that these modules require the addition of multiple additional parts and machining steps which results in longer assembly times and labor costs. As the design of slot filler boards is tightly coupled to the design of the electronics boards they replace, minor changes in electronics often requires extensive redesign of the slot filler board. This in turn increases development time.

OBJECT OF THE INVENTION

In view of the foregoing it is an object of the present invention to provide a slot filler module which provides a surface for LCMs to expand against, has approximately the same mass and center of mass as electronics modules, is ESD compliant, and also provides suitable grounding. It is a further object of the present invention to provide a module which is low-cost, not labor intensive to manufacture and can be designed and manufactured in a manner that minimizes engineering effort.

SUMMARY OF THE INVENTION

The present invention comprises a slot filler module. The slot filler module includes a RIM molded encapsulant, an insert disposed in a predetermined location within the encapsulant and a connector disposed proximate a first end of the RIM molded encapsulant.

BRIEF DESCRIPTION OF THE DRAWINGS

The invention will be better understood by reference to the following more detailed description and accompanying drawings in which.

DETAILED DESCRIPTION

Figure 1:
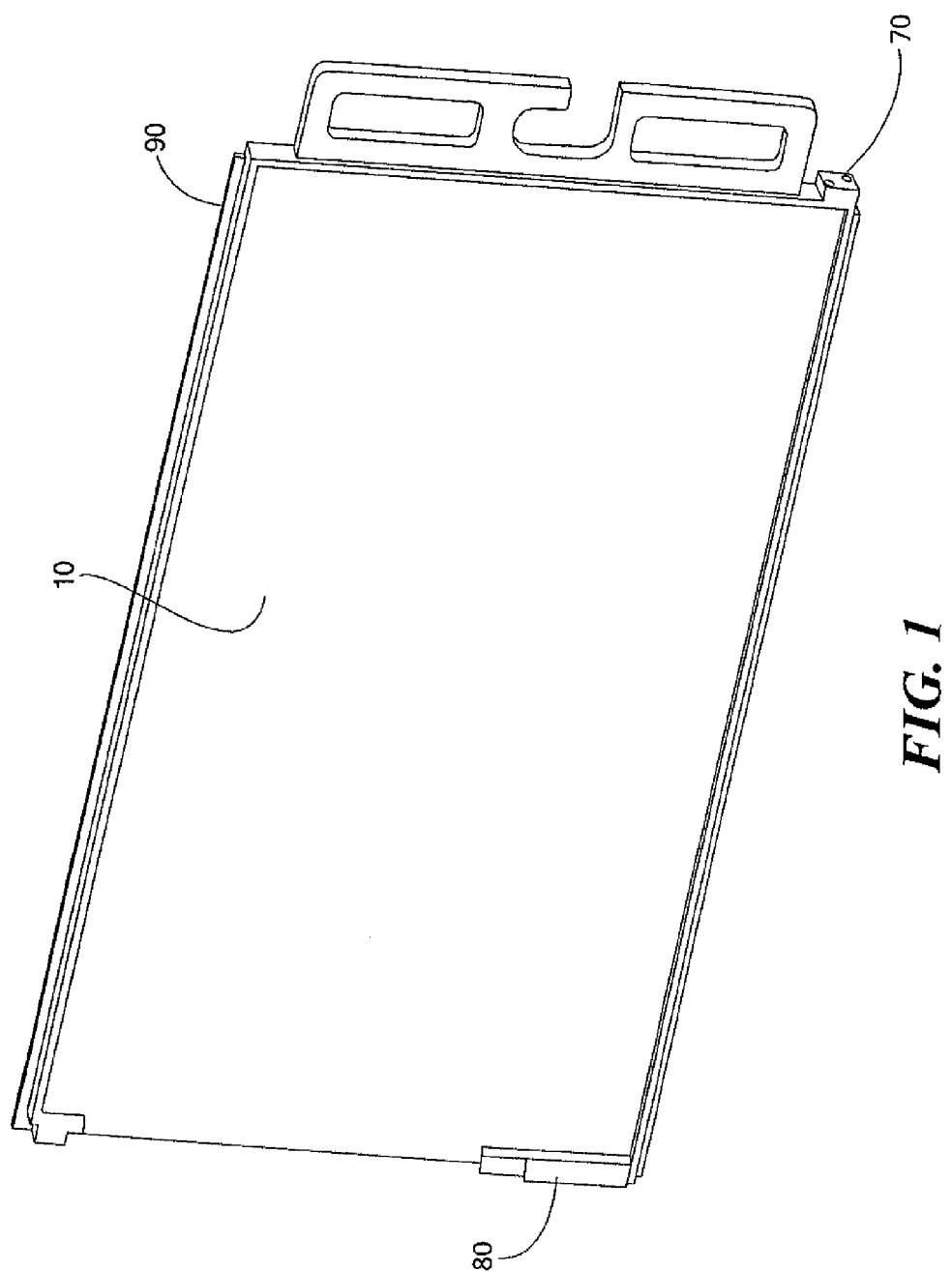
FIG. 1 is a picture of the RIM filler module of the present invention.
Figure 2:
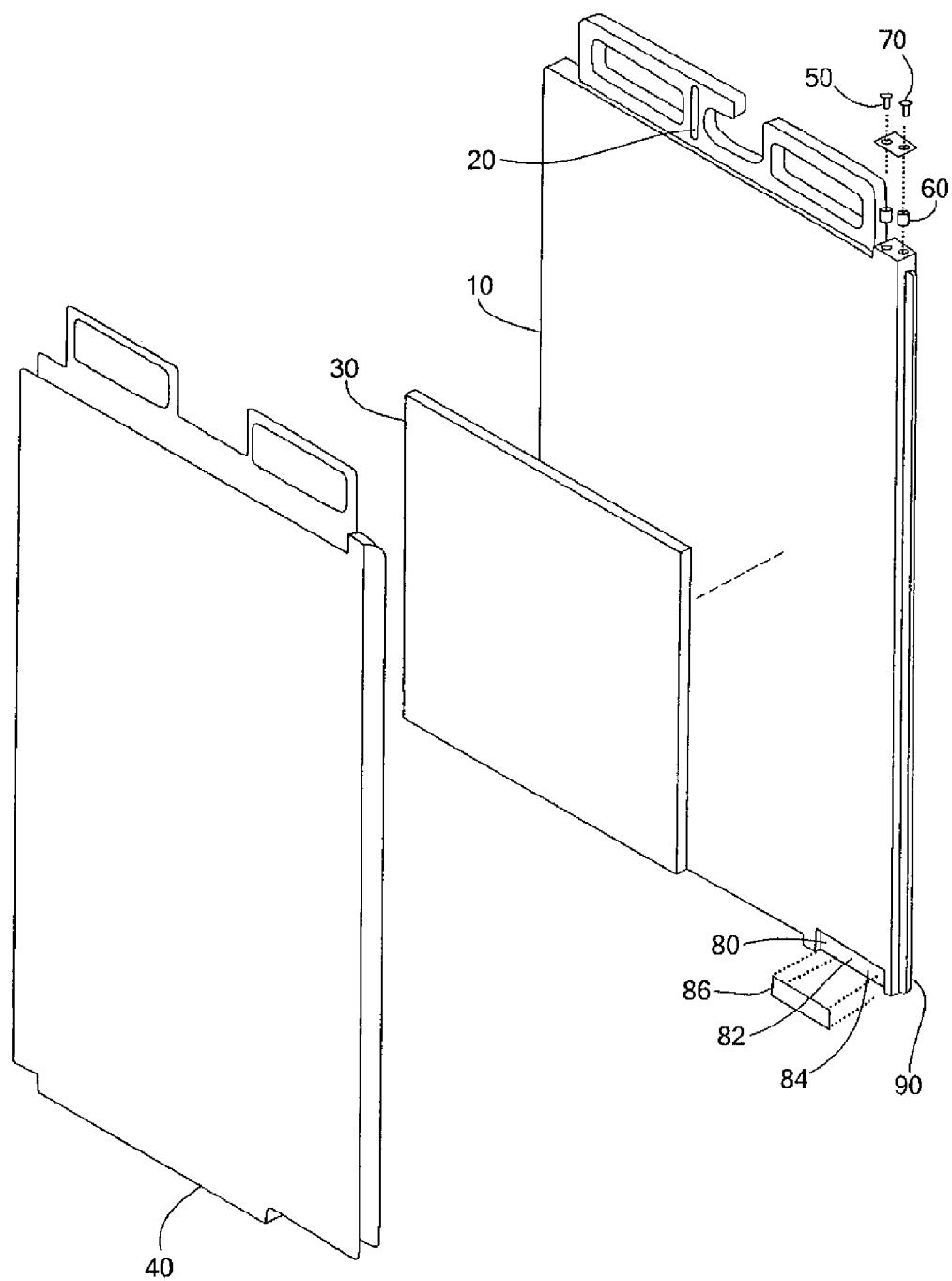
FIG. 2 is an exploded view of the RIM filler module of FIG. 1.
Figure 3:
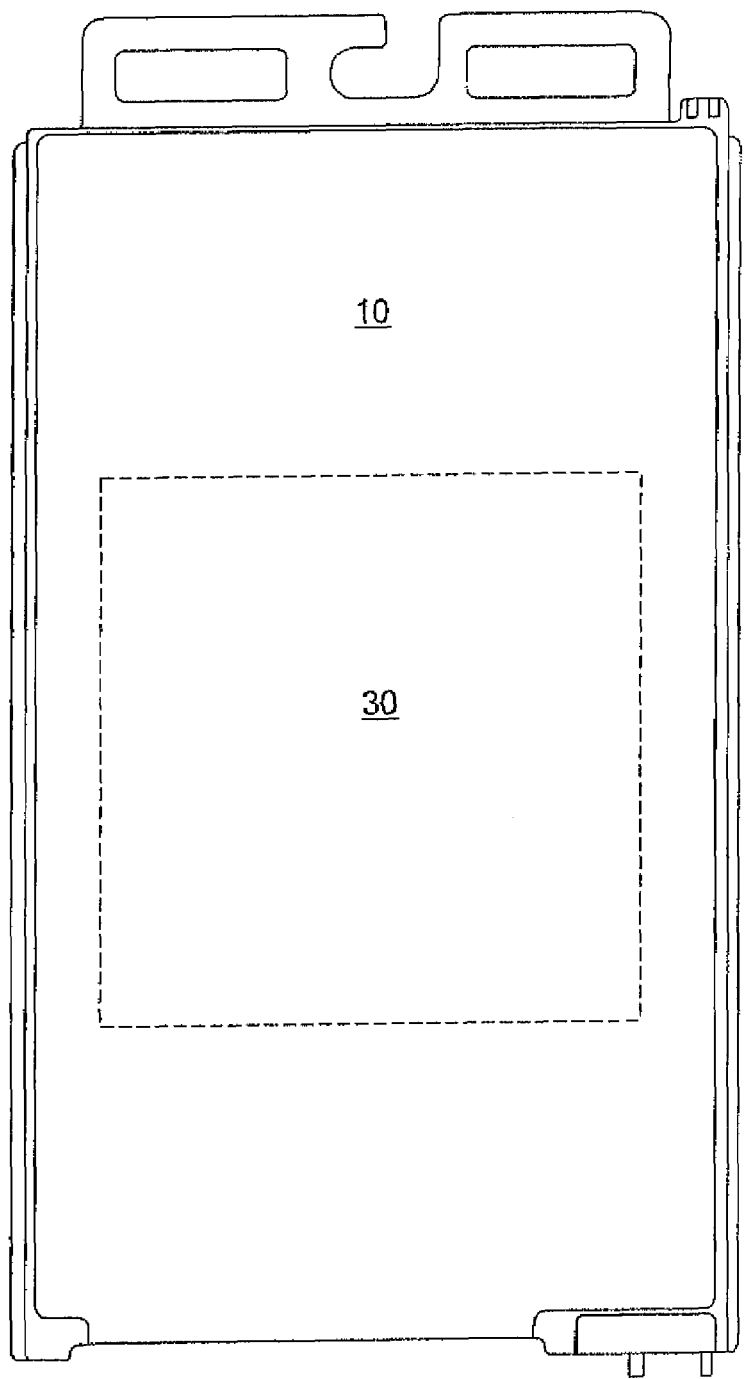
FIG. 3 is a diagram showing the steel insert of the RIM filler module.

Reaction Injection Molding (RIM) is a well-known chemical process for molding plastics that mixes and meters liquid raw materials and then injects them into a mold cavity. The part then forms in the mold cavity from which, after a certain time, the part is released. Other agents can also be added to the mixture of liquid raw material prior to injection to provide desired properties such as added strength. Some of the materials used in RIM process include rigid urethanes, urethane elastomers and urethane foam. The RIM process requires much less pressure than conventional injection molding, and as such can be used to form larger sized modules. If desired, the finished polymer part may have a smooth and hard exterior surface while maintaining a generally porous interior.

We have recognized that the RIM process is well suited for this slot filler module application due to several factors. A first factor is the size of the module. The present module (in the preferred embodiment) has a size which is larger than two square feet (60.96 cm). Given the size requirement, conventional injection molding would require prohibitively large pressures to properly form the module. RIM requires much lower pressure to produce the module having the required size.

A second factor is the mass of the module. In this embodiment the module is required to weigh more than two and a half pounds (1.125 kg). A further requirement of this particular application is that both thin and thick wall sections are present. Still a further requirement of the present embodiment is that the module be relatively stiff and have the ability to resist impact. Thus, if the resulting module is dropped it won't easily fracture, deform or be rendered unusable. Yet another requirement of the present application is that the module has an insert molded into it. For all these reasons a module of RIM encapsulant is an attractive solution.

Referring now to FIGS. 1-4 in which like parts have like identifiers, the RIM slot filler module 10 is shown. In the preferred embodiment the Reaction Injection Molded (RIM)

slot filler module 10 is molded out of BAYDUR 726 IBS™ (a proprietary urethane material from Bayer).

The module 10 has an embedded insert 30, which is positioned within the encapsulant prior to the reaction injection molding operation to accurately locate or position the insert to provide the center of mass of the module 10 at a desired location within the module. In a preferred embodiment the insert is comprised of steel, although other embodiments could use an insert comprised of different material depending on the application and environment the RIM slot filler module is used in. Further, while a single insert is shown and described, any number of inserts could be used. The inserts can be placed anywhere within the encapsulant to provide the desired mass, center of mass and moment of inertia for the module. The inserts can be located proximate the side edges of the module in order to provide a stiffening function. The insert or inserts are positioned within the mold prior to the material injection. The encapsulant thus forms and surrounds the insert or inserts. In a particular embodiment the insert may be in electrical communication with a reference potential such as ground to provide RF shielding.

The module 10 preferably also includes a connector 80 which allows the module to be inserted into the backplane of the system. The connector 80 provides an interconnect which indicates the presence of the module in the slot, which is required in some systems to allow the system to power-up. Connector 80 is secured to the encapsulant 10 by way of threaded inserts 82 and screws 84. Additionally a protective cover 86 may be installed which protects an exposed surface of the connector and screws and prevents the connector and screws from interfering with other modules such as the LCMs, particularly when the module is inserted or removed from a slot.

The module preferably also includes a latch assembly which is used to secure the module within the system. The latch assembly includes a latch plate 50, threaded inserts 60 and screws 70. The threaded inserts 60 are installed within the encapsulant and provide a mechanism for screws 70 to secure latch plate 50 to the encapsulant 10.

The module 10 may also include an Electro Static Discharge (ESD) dissipative sheet 40 disposed on surfaces thereof. The ESD sheet may be connected to reference potential such as ground through the connecter assembly or the latch assembly. The ESD sheet 40 is used to ensure ESD compliance. In the preferred embodiment a single sheet is used which wraps around the module such that both the front surface and rear surface of the module are covered. Alternatively, individual sheets for each surface could be used, as well as a piece which covers only a portion of a surface. The ESD sheet is preferably adhesively attached to the encapsulant, although other attachment methods could also be used.

In the preferred embodiment the encapsulant is formed providing edge guides 90 on each side edge of the module. The edge guides are used to guide the module during installation of the module within a slot of the backplane. Further, the encapsulant is preferably formed providing an integrated handle 20 which is used for installation and removal of the module within the system. The RIM slot filler module may further include one or more vias through which electronics or cooling fluid may flow. One or more heatsinks and electronics may also be included as part of the slot filler module assembly.

Figure 4:
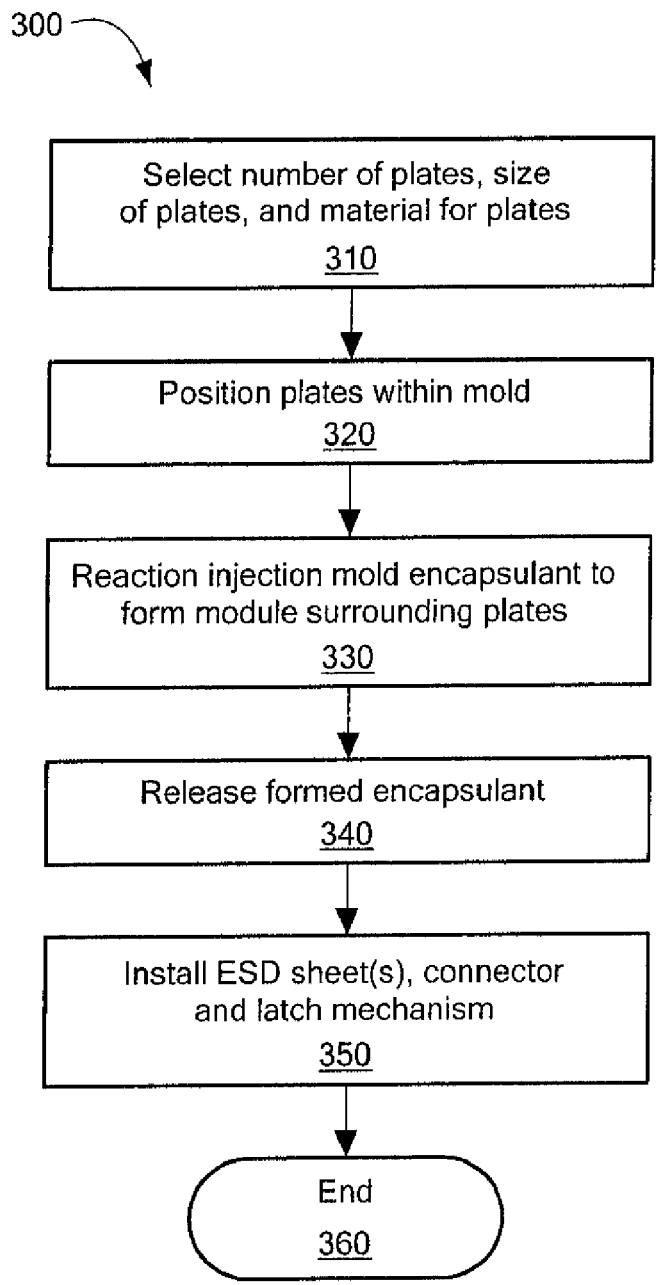
FIG. 4 is a flow chart of the method of the present invention.

A flow chart of the presently disclosed method of producing an RIM slot filler module is depicted in FIG. 4. The flow diagrams illustrate the functional information one of ordinary skill in the art requires to fabricate circuits to perform the processing required in accordance with the present invention.

It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Referring now to FIG. 4, the method 300 of manufacturing a RIM slot filler module is shown. The first step 310 comprises selecting the insert or inserts to be used. The number of inserts, the material the inserts are made of and the positioning of the inserts are determined at this step.

Step 320 involves positioning the inserts within the mold. The position of the insert or inserts is selected to provide a center of mass at a predetermined location within the encapsulant.

Step 330 is executed next, wherein the RIM process takes place. Materials are fed into the mold where a reaction takes place. This reaction results in an encapsulant being formed and expanding to fill the mold. The insert or inserts are surrounded by the resulting encapsulant.

After a predetermined period of time the encapsulant is released from the mold, as recited in step 340.

Following step 340, step 350 is performed wherein an ESD sheet is attached to the encapsulant. In the preferred embodiment a single sheet is wrapped around the encapsulant thereby covering both the front surface and rear surface of the encapsulant. Alternately only one surface could be covered by the sheet or multiple sheets could be used.

At step 360 the connector is installed. The connector is used to mate the module with the system backplane and is used to indicate the presence of a module within the slot.

Step 370 presents the installation of a latch mechanism on the module. This latch mechanism is used to secure the module within the slot.

A RIM slot filler module and the method for producing the module have been presented. The module comprises a RIM encapsulant, an insert disposed within the encapsulant, a connector assembly for mating the module to a backplane and a latch assembly for securing the module within a slot.

The present invention provides substantial cost savings as compared to prior art slot filler modules and further provides a reduction in the number of assembled pieces, thereby reducing cost to assemble the slot filler module.

This use of composite and in-mold assemblies of dissimilar materials in slot-filler modules and machine structures is substantially different from prior art and competing state of the art designs. Near net shape processes are used to form the product, thus decreasing the manufacturing complexity and chance/sources of manufacturing errors.

The present invention provides a variable mass and center of mass design that is not known in the prior art. Changes can be easily made by moving the insert or inserts in the mold. Another advantage is a shorter ordering schedule and faster ramp (larger quantities available in a shorter time). The presently disclosed RIM slot filler module has very few discrete parts as compared to the prior art slot filler module assemblies and is thus more robust and breakage free. Further, the present RIM slot filler module is less likely to cause operator injuries due to the plastic body. The reduction in piece-parts and associated assembly tasks/tolerances provides an additional cost advantage.

Having described preferred embodiments of the invention it will now become apparent to those of ordinary skill in the art that other embodiments incorporating these concepts may be used.

What is claimed is:

1. A slot filler module for replacing an optional electronics module in a system, comprising:
    a reaction injection molded (RIM) encapsulant;
    a connector assembly disposed proximate a first end of said encapsulant; and
    at least one insert disposed in a predetermined location embedded within said encapsulant,
    wherein said encapsulant and said at least one insert have approximately the same mass as the electronics module, and
    wherein the connector assembly comprises:
    at least one threaded insert disposed in said module;
    a connector disposed over said at least one threaded insert; and
    a fastener removably insertable within the at least one threaded insert, the fastener securing the connector to the module.

2. The slot filler module of claim 1 wherein said at least one insert is disposed in a predetermined location embedded within said encapsulant to provide a center of mass of said module in a predetermined location.

3. The slot filler module of claim 1 further comprising an ESD sheet disposed over at least a portion of a first surface of said encapsulant.

4. The slot filler module of claim 1 further comprising a latch assembly disposed proximate a second end of said encapsulant.

5. The slot filler module of claim 1 wherein said at least one insert is comprised of steel.

6. The slot filler module of claim 1 wherein said encapsulant is selected from the group consisting of rigid urethanes, urethane elastomers, and urethane foams.

7. The slot filler module of claim 1 wherein at least one surface of said encapsulant is generally smooth and is able to withstand compressive forces.

8. The slot filler module of claim 1 further comprising a guide disposed along at least a first portion of said module.

9. The slot filler module of claim 1 further comprising a handle disposed at a second end of said module.

10. The slot filler module of claim 1 wherein said at least one insert is in electrical communication with a reference potential.

11. A slot filler module for replacing an optional electronics module in a system, comprising:
    a reaction injection molded (RIM) encapsulant;
    a latch assembly disposed proximate a second end of said encapsulant; and
    at least one insert disposed in a predetermined location embedded within said encapsulant,
    wherein said encapsulant and said at least one insert have approximately the same mass as the electronics module,
    wherein said latch assembly comprises:
    at least one threaded insert disposed in said module,
    a latch plate disposed over said at least one threaded insert; and
    a fastener removably insertable within said at least one threaded insert, said fastener securing said latch plate to said module.

12. A slot filler module for replacing an optional electronics module in a system, comprising:
    a reaction injection molded (RIM) encapsulant;
    a connector assembly disposed proximate a first end of said encapsulant;
    a cover disposed over at least a portion of said connector assembly; and
    at least one insert disposed in a predetermined location embedded within said encapsulant,
    wherein said encapsulant and said at least one insert have approximately the same mass as the electronics module.

13. The slot filler module of claim 12 wherein said at least one insert is disposed in a predetermined location embedded within said encapsulant to provide a center of mass of said module in a predetermined location.

14. The slot filler module of claim 12, further comprising an ESD sheet disposed over at least a portion of a first surface of said encapsulant.

15. The slot filler module of claim 12, further comprising a latch assembly disposed proximate a second end of said encapsulant.

16. The slot filler module of claim 12 wherein said at least one insert is comprised of steel, and
    wherein said encapsulant is selected from the group consisting of rigid urethanes, urethane elastomers, and urethane foams.

17. The slot filler module of claim 12 wherein at least one surface of said encapsulant is generally smooth and is able to withstand compressive forces.

18. The slot filler module of claim 12, further comprising a guide disposed along at least a first portion of said module.

19. The slot filler module of claim 12, further comprising a handle disposed at a second end of said module.

20. The slot filler module of claim 12 wherein said at least one insert is in electrical communication with a reference potential.

* * * * *